(12) United States Patent
Barmet et al.

(10) Patent No.: US 8,093,899 B2
(45) Date of Patent: Jan. 10, 2012

(54) MAGNETIC FIELD PROBE AND METHOD FOR MANUFACTURING THE SAME

(75) Inventors: Christoph Barmet, Zürich (CH); Nicola De Zanche, Edmonton (CA); Klass Prüssmann, Zürich (CH)

(73) Assignee: Eidgenössische Technische Hochschule (ETH) and Universität Zürich, Zürich (CH)

( * ) Notice: Subject to any disclaimer, the term of this patent is extended or adjusted under 35 U.S.C. 154(b) by 265 days.

(21) Appl. No.: 12/297,460

(22) PCT Filed: Apr. 19, 2007

(86) PCT No.: PCT/EP2007/003442
§ 371 (c)(1),
(2), (4) Date: Feb. 27, 2009

(87) PCT Pub. No.: WO2007/118715
PCT Pub. Date: Oct. 25, 2007

(65) Prior Publication Data
US 2009/0295389 A1  Dec. 3, 2009

(30) Foreign Application Priority Data
Apr. 19, 2006 (EP) .................................. 06008042

(51) Int. Cl.
*G01V 3/00* (2006.01)
(52) U.S. Cl. ........................ 324/321; 324/318
(58) Field of Classification Search .................. 324/321, 324/318
See application file for complete search history.

(56) References Cited

U.S. PATENT DOCUMENTS

| 3,091,732 | A |   | 5/1963  | Anderson et al. |
|-----------|---|---|---------|-----------------|
| 4,775,836 | A |   | 10/1988 | Starewicz et al. |
| 5,302,900 | A |   | 4/1994  | Cummings |
| 5,684,401 | A | * | 11/1997 | Peck et al. ............... 324/318 |
| 5,831,434 | A |   | 11/1998 | Shigezane et al. |
| 6,087,832 | A | * | 7/2000  | Doty ......................... 324/318 |

FOREIGN PATENT DOCUMENTS

| DE | 195 32 569 A1 | 3/1997 |
| EP | 1 582 886 A1  | 10/2005 |
| WO | 9600400 A1    | 1/1996 |
| WO | 2005034150 A2 | 4/2005 |

OTHER PUBLICATIONS

International Search Report for PCT/EP2007/003442.

* cited by examiner

*Primary Examiner* — Louis Arana
(74) *Attorney, Agent, or Firm* — McCormick, Paulding & Huber LLP (57) ABSTRACT

A magnetic field probe comprises a sample that exhibits magnetic resonance at an operating frequency, an electrically conductive structure surrounding the sample for receiving a magnetic resonance signal therefrom, and a solid jacket encasing the sample and the conductive structure. The jacket is made of a hardened two-component epoxy system containing a paramagnetic dopant dissolved therein, with the concentration of the dopant being chosen such that the jacket has a magnetic susceptibility that is substantially identical to the magnetic susceptibility of the conductive structure.

23 Claims, 2 Drawing Sheets

MAGNETIC FIELD PROBE AND METHOD FOR MANUFACTURING THE SAME

CROSS REFERENCE TO RELATED APPLICATIONS

This application claims the benefit of PCT Application No. PCT/EP2007/003442, filed on Apr. 19, 2007 and European Patent Application No. 06008042.1, filed Apr. 19, 2006, the disclosures of which are herein incorporated by reference in their entirety.

TECHNICAL FIELD OF THE INVENTION

The present invention relates to a magnetic field probe particularly for magnetic resonance applications. Furthermore, the invention relates to a method for manufacturing such a magnetic field probe and to a nuclear magnetic resonance imaging apparatus comprising such a field probe. Moreover, the invention relates to nuclear magnetic resonance probes. Still further, the invention relates a method of adjusting magnetic field homogeneity using a doped two-component epoxy system.

BACKGROUND OF THE INVENTION

Despite continued advances in magnetic resonance (MR) instrumentation, imperfections in the magnetic field evolution still hamper numerous MR procedures. Field perturbations are caused by a range of mechanisms, including eddy currents, limited gradient bandwidth, and heating effects. Often such errors can be addressed by means of signal processing. However, to do so these errors need to be accurately known. Reproducible field perturbations can be determined approximately by preparatory measurements. Alternatively, it has been proposed to monitor the relevant field evolution directly during each actual scan, using appropriately designed magnetic field probes.

Published European Patent Application EP 1 582 886 A1 discloses a method of MR imaging wherein additional data are acquired, during execution of a MR sequence, from at least one monitoring magnetic field probe positioned in the vicinity of and surrounding an object of interest. The magnetic field probes exploit the presence of a strong magnetic field needed for the MR measurements; accordingly, they are based upon magnetic resonance in a small sample volume of an MR active substance. Upon MR excitation of the object of interest, there is a concomitant MR excitation of the substance within the probe, the resonance frequency of which is proportional to the magnitude of the local magnetic field.

As discussed in EP 1 582 886 A1, magnetic resonance in the probe sample can be based on nuclear magnetic resonance (NMR), in which case the probe sample shall contain a NMR active nuclear species such as $^1$H, $^{13}$C, $^{17}$O, $^{19}$F or $^{31}$P. Magnetic resonance imaging (MRI) is mostly based on $^1$H. As is well known, the choice of the nucleus for probing is subject to several considerations, and, based on the chosen nucleus, the choice of the substance used as the sample in a magnetic field probe is also subject to several considerations. According to EP 1 582 886 A1, normal water ($^1$H$_2$O) is a preferred probe substance based on $^1$H whereas suitable substances based on $^{19}$F include hexafluorobenzene and trifluoromethylsulfonate.

A key challenge in designing magnetic field probes based on magnetic resonance (henceforth also called "MR-based magnetic field probes") is obtaining strong and long-lived signals from probe samples that are small enough to avoid dephasing by externally applied gradients. Preferably, the probe samples should have a volume of less than 1 μl. For extracting strong signals from such a small sample it is essential to mount it tightly in a receiver coil. However, nearby material interfaces tend to induce magnetic field variations in the probe sample, thus limiting its signal lifetime. For example, when using water as the probe substance by placing a small water droplet in a thin glass capillary surrounded just by air and a tightly wound copper solenoid, impractically short signal lifetimes of less than 10 ms are achieved.

An improved MR-based magnetic field probe has been described in *De Zanche N, Barmet C, Meier D, Pruessmann K. NMR probes for magnetic field monitoring during MRI. Proceedings* 13th *Scientific Meeting, International Society for Magnetic Resonance in Medicine;* 2005, May, p 791. High signal-to-noise signal detection was performed inductively by means of solenoidal microcoils connected to low-noise preamplifiers. Cross-talk was limited primarily by reducing unwanted inductive pickup. All signal paths or inductors that could receive NMR signal because of their geometrical arrangement were either shielded or routed to minimize flux linkage with nuclear spins within the imaging volume. The circuit board containing components for detuning, matching and preamplification was consequently shielded and its connection to the solenoid containing the sample was made using a coaxial cable. Since such a probe is to be excited by an external magnetic field and thus cannot be shielded, particular attention was devoted to minimize the sensitivity of the solenoid to spins outside of its interior. To reduce field inhomogeneities within the sample, susceptibility matching techniques were employed.

In a specific embodiment of the magnetic field probe disclosed by De Zanche, loc. cit., a small droplet of water was injected inside a precision 2.2 mm inner diameter pyrex capillary previously filled with a perfluorinated hydrocarbon (FC-77 Fluorinert®; 3M, USA, henceforth simply called "FC77"). FC77 was also used to displace air within and around the solenoid, enclosing the complete probe within a 2 cm diameter cylinder. Due to the residual susceptibility mismatch between FC77 and copper, the solenoid's diameter was chosen to be 0.5 mm larger than the capillary's 2.5 mm outer diameter.

A disadvantage of the above described magnetic field probe is due to the fact that the magnetic susceptibilities of copper (−9.65 ppm) and FC-77 (approximately −8 ppm) are by no means identical. This residual susceptibility mismatch causes an undesirable shortening of the probe's resonance signal. A further disadvantage is caused by the fact that FC-77 is a liquid at room temperature, which is impractical for the purpose of enclosing the complete probe.

Planar microcoil-based microfluidic NMR probes have been described in Massin, C. et al., *Journal of Magnetic Resonance;* 164 (2003) pp. 242-255, the contents of which are incorporated herein by reference. These probes comprise electroplated planar microcoils integrated on a glass substrate with etched microfluidic channels. The main factor limiting sensitivity for high-resolution applications has been reported by *Massin, loc. cit.* as being probe-induced static magnetic field distortions; these are mainly caused by differences in bulk magnetic susceptibility of materials composing the probe.

U.S. Pat. No. 3,091,732 discloses a gyromagnetic resonance probe having transmitter and receiver coils embedded in a magnetic susceptibility matched material comprising by weight about 3 parts of paramagnetic manganese dioxide to 100 parts by weight of a diamagnetic epoxy resin.

SUMMARY OF THE INVENTION

It is the principal object of the present invention to overcome the limitations and disadvantages of currently known magnetic field probes for magnetic resonance applications. A further object of the present invention is to improve the accuracy of MR spectroscopy and MR imaging methods.

The foregoing and further objects are achieved by the magnetic field probe of this invention, by the method for manufacturing a magnetic field probe of this invention, by the nuclear magnetic resonance apparatus of this invention, by the nuclear magnetic resonance probes of this invention, and by a method of adjusting magnetic field homogeneity using a doped two-component epoxy system according to this invention.

According to a first aspect of this invention, a magnetic field probe comprises:
  a sample that exhibits magnetic resonance at an operating frequency;
  an electrically conductive structure surrounding the sample for receiving a magnetic resonance signal therefrom; and
  a solid jacket encasing the sample and the conductive structure, the jacket having a magnetic susceptibility that is substantially identical to the magnetic susceptibility of the conductive structure;
wherein
  the jacket is made of a hardened two-component epoxy system containing a paramagnetic dopant dissolved therein, the concentration of the dopant being chosen such that the jacket has a magnetic susceptibility that is substantially identical to the magnetic susceptibility of the conductive structure.

This magnetic field probe is particularly suitable for—although not limited to—magnetic resonance applications such as nuclear magnetic resonance (NMR) spectroscopy, magnetic resonance imaging (MRI) and electron spin paramagnetic resonance (EPR). However, it may also be used for precision measurements of magnetic fields. Advantageously, particularly for NMR applications, the sample is liquid, which allows for longer-lived resonance signals than in the case of solid samples.

Due to the fact that the jacket material has a magnetic susceptibility that is substantially identical to the magnetic susceptibility of the electrically conductive structure, the drawbacks caused by susceptibility mismatch are substantially eliminated, thus leading to an increased lifetime of the probe signal. Due to the fact that the jacket material is solid, it is possible to manufacture compact probes having a small sample volume and also a small distance between the sample and the surrounding conductive structure; moreover, such probes are easy to handle.

The jacket is made from a hardened two-component epoxy system, i.e. a type of plastics material also known as "cured" epoxy system formed by mixing an epoxy resin and a hardening or curing agent. By virtue of the fact that the paramagnetic dopant is dissolved in the hardened two-component epoxy system, the jacket is highly homogeneous and thus provides an environment with a uniform magnetic susceptibility on a microscopic scale. In particular, this allows two exploit the advantages of a magnetic susceptibility matched environment for miniaturized devices with very small sample volumes and very small electrically conducting structures. This is in contrast to the prior art doped plastics materials that are obtained by suspending an insoluble doping agent—such as manganese dioxide in the case of U.S. Pat. No. 3,091, 732—in powder form in a polymeric matrix. In those systems, the presence of dopant grains in the polymeric matrix gives rise to a non-uniform magnetic susceptibility on a scale that is comparable to the distance between dopant grains.

Because the concentration of the dopant dissolved in the two-component epoxy system can be selected from a whole range of concentrations, it is possible to precisely match the magnetic susceptibility of the jacket to that of the conductive structure. In other words, the dopant concentration represents what might be called a "susceptibility tuning parameter".

According to a further aspect of this invention, a method for manufacturing a magnetic field probe comprises the steps of:
a) providing a sample that exhibits magnetic resonance at an operating frequency and further providing an electrically conductive structure surrounding the sample for receiving a magnetic resonance signal therefrom;
b) providing a first amount of an epoxy resin and admixing thereto a second amount of a solution comprising a paramagnetic dopant in a solvent, thus forming a paramagnetically doped epoxy resin;
c) degassing the doped epoxy resin;
d) admixing a third amount of a hardening agent to the doped epoxy resin, thus forming a doped two-component epoxy system;
e) optionally degassing the doped two-component epoxy system;
f) within a casting mold, shaping the doped two-component epoxy system around the sample and the conductive structure so as to form a jacket;
g) allowing the doped two-component epoxy system to harden;
h) optionally removing the casting mold;
wherein the content of paramagnetic dopant in the doped two-component epoxy system is chosen to provide the jacket with a magnetic susceptibility that is substantially identical to the magnetic susceptibility of the conductive structure.

According to a further aspect of this invention, a magnetic resonance apparatus comprises:
  a main magnetic field magnet;
  gradient coils for generating gradient magnetic fields superimposed to the main magnetic field;
  means for delivering a radio frequency signal at an operating frequency;
  at least one radio frequency receiver coil for acquiring a plurality of object signals from the object to be examined;
  magnetic field detecting means positioned in the vicinity of and surrounding the object to be examined;
  means for calculating a model of the magnetic field behavior in the object from data from the local magnetic field detecting means; and
  means for reconstructing images or spectra from the additional data from the magnetic field detecting means in conjunction with the object signals;
the magnetic field detecting means comprising at least one magnetic field probe according to this invention.

According to a further aspect of this invention, a nuclear magnetic resonance probe comprises:
  a compartment for containment of a liquid sample that exhibits nuclear magnetic resonance at an operating frequency;
  an electrically conductive structure adjacent to the sample compartment for receiving a nuclear magnetic resonance signal from the sample;
  a solid jacket encasing the sample and the conductive structure;
wherein
  the jacket is made of a hardened two-component epoxy system containing a paramagnetic dopant dissolved therein, the concentration of the dopant being chosen such that the jacket has a magnetic susceptibility that is substantially identical to the magnetic susceptibility of the conductive structure.

In particular, the conductive structure may surround the sample compartment.

According to a further aspect of this invention, a nuclear magnetic resonance probe comprises:
- a substantially flat compartment for containment of a liquid sample that exhibits nuclear magnetic resonance at an operating frequency, the sample compartment being formed within a block made of a solid block material;
- an electrically conductive structure adjacent to the sample compartment for receiving a nuclear magnetic resonance signal from the sample;

wherein
- the block is made of a hardened two-component epoxy system containing a paramagnetic dopant dissolved therein, the concentration of the dopant being chosen such that the block has a magnetic susceptibility that is substantially identical to the magnetic susceptibility of the conductive structure.

In particular, the conductive structure may be substantially flat.

According to a further aspect of this invention, a doped two-component epoxy system is used for adjusting magnetic field homogeneity within a device in a magnetic field, wherein the two-component epoxy system contains a paramagnetic dopant dissolved therein in a concentration chosen such that the magnetic susceptibility of the doped two-component epoxy system is substantially equal to the magnetic susceptibility of said device or a part thereof. While in many applications the adjustment will consist in improving the magnetic field homogeneity.

In general, the improvement of magnetic field homogeneity is advantageous in any applications that are sensitive to local inhomogeneities of the magnetic field. This is the case, in particular, for magnetic resonance measurements, including NMR and EPR. Examples for devices wherein an improved magnetic field homogeneity is advantageous are magnetic resonance probes for experiments with very small objects. In such applications, signal gain is always crucial, which means that the magnetic resonance detection devices, usually induction coils, must be placed very closed to the object of interest. The proximity and the small size exacerbates the influence of the materials and geometry on the local magnetic field within the object of interest. Specific examples of such devices are probe heads for field monitoring in MRI, probe heads for laboratory NMR measurements in sample tubes, susceptibility plugs for laboratory NMR measurements in sample tubes, probe heads for flow-through NMR in sample tubes, probe heads for MR microscopy including "cell imaging", and probe heads for EPR. Interventional MRI is another application requiring close proximity between external parts and sampled material, since devices and instruments such as catheters, scalpels and clamps are in contact with tissue to be imaged. These parts often cause massive image artifacts and losses due to field distortions. Accordingly, the doped two-component epoxy system may be used for improving magnetic field homogeneity of surgical tools and of catheters and parts thereof.

Critical situations due to magnetic field inhomogeneity may also arise with larger scale objects and at larger distances if comparatively large amounts of a material are used. This may be the case, for example, with holders, frames, packaging materials and cable guides. In particular, the doped two-component epoxy system may be used for improving magnetic field homogeneity within receiver coils and array with plastics parts that are susceptibility matched to the surrounding air and to magnetically matched interior coatings and object holders of NMR and MRI instruments. A further application is the construction of magnetically tailored containers for sample liquids—so called phantoms—for MR experiments. This is particularly important with structured phantoms made of plastic or glass and filled with water. In order to avoid field inhomogeneities, the doped two-component epoxy system may be used to build "magnetically neutral", completely air-matched phantoms, but also magnetically homogeneous phantoms wherein the container is susceptibility matched to the filling.

Beyond magnetic resonance, there are still further applications wherein a doped two-component epoxy system may be used to improve magnetic field homogeneity within a device in a magnetic field. In general, these rely on mechanisms that are very sensitive on magnetism, such as in SQUID detectors and in magnetic storage media.

Advantageous embodiments are further defined.

Advantageously, the paramagnetic dopant comprises a metal ion or a rare earth metal ion, particularly $Fe^{2+}$, $Fe^{3+}$, $Er^{3+}$, $Dy^{3+}$, or $Gd^{3+}$. In practice, such ions may be introduced by dissolving corresponding salts such as $FeCl_2$, $FeCl_3$ or $Fe(NO_3)_3$ $Er(NO_3)_3$, $Dy(NO_3)_3$, or $Gd(NO_3)_3$. Particularly the rare earth metal salts have been found to allow for large susceptibility changes with moderate dopant concentrations.

It is known that the magnetic field induced by a homogeneous external magnetic field within ellipsoidal objects of homogeneous magnetic susceptibility is again homogeneous (see e.g. *Massin, loc. cit.*). Accordingly, the jacket preferably has ellipsoidal geometry, which includes the special case of spheroidal geometry and is approximated by an elongate cylindrical geometry. The term "elongate cylindrical" shall be understood as referring to a cylinder with a length L that substantially exceeds the diameter D, e.g. with L/D=5 or more.

The electrically conductive structure may have one of several shapes, depending on the type of application. For example, it may have a saddle-type geometry. Advantageously, however, the conductive structure comprises at least one loop portion. In particular, it may be a solenoid with several loops.

Preferably, the sample is substantially spherical. Spherical samples have the advantage of being isotropic and hence exhibiting the same susceptibility to gradient dephasing in all directions. The magnetic permeability of the sample substance will typically deviate somewhat from that of the ambient medium, so that the sample will cause local deviations of the magnetic field strength. However, inside a spherical sample the added field component is homogeneous, thus preventing additional signal dephasing.

According to a particularly advantageous embodiment, the magnetic field probe further comprises a cylindrical core arranged within the conductive structure, the core comprising a pair of terminal sections and a central section embedded therebetween. The central section is formed by the sample, and the terminal sections are formed by a filler medium that does not exhibit magnetic resonance at the operating frequency. By selecting a filler medium with a magnetic susceptibility that is substantially identical to the magnetic susceptibility of the sample, it is possible to further improve the probe's resonance signal. Preferably, the core is constituted by a substantially cylindrical housing such as a pyrex capillary tube that contains the sample and the filler medium.

Advantageously, the sample and the filler medium are mutually immiscible liquids. In particular, it has been found advantageous to use cyclohexane or hexafluorobenzene as sample liquid for $^1$H-NMR and $^{19}$F-NMR, respectively, because these highly symmetrical molecules have only one resonance line and a comparatively large number of active nuclei. Both species are not miscible with water based filler media. Accordingly, for $^1$H-NMR it is advantageous to use cyclohexane in combination with a filler medium based on heavy water; for $^{19}$F-NMR it is advantageous to use hexafluorobenzene in combination with a filler medium based on normal water. Because water has a substantially larger surface tension than cyclohexane and hexafluorobenzene, respectively, the sample droplet embedded within the two filler sections will have convex interfaces therewith. By choosing an appropriate amount of sample liquid, the latter will assume a substantially spherical shape.

Preferably, the filler medium is a solution of a paramagnetic salt in water or heavy water, the concentration of the salt being chosen such that the solution has a magnetic susceptibility that is substantially identical to the magnetic susceptibility of the sample. Manganese(II) salts and copper(II) salts, particularly $MnCl_2$ and $CuSO_4$, respectively, have been found to be suitable paramagnetic salts for the present purpose.

According to a preferred embodiment of the method for manufacturing a magnetic field probe, the solvent used to form a solution comprising the paramagnetic dopant for doping the jacket material is acetone.

Preferably, step a) of the method comprises the steps of:
providing a container with an amount of the liquid sample and an amount of the liquid filler medium immiscible therewith so as to form a two-layer system;
providing an open-ended glass capillary tube having a proximal end and a distal end, the proximal end being connected to a suction device for drawing liquid into the tube;
immersing the distal end into the layer of liquid filler medium;
drawing a first portion of filler medium into the capillary tube;
moving the distal end into the layer of liquid sample;
drawing a portion of sample into the capillary tube;
moving the distal end back into the layer of liquid filler medium;
drawing a second portion of filler medium into the capillary tube;
raising the distal end out of the two-layer system;
sealing off the distal end and the proximal end so as to form a sealed tube, the sealed tube thus forming a substantially cylindrical core comprising:
the portion of sample forming a central section of the core;
the first portion and the second portion of filler medium, or fractions thereof, embedding the central section so as to form terminal sections of the core;
arranging an electrically conductive structure around the core;
arranging the jacket around the core and the conductive structure;
wherein:
the filler medium has a magnetic susceptibility that is substantially identical to the magnetic susceptibility of the sample, and
the jacket has a magnetic susceptibility that is substantially identical to the magnetic susceptibility of the conductive structure.

According to a preferred embodiment of the nuclear magnetic resonance probe, means are provided for flowing the sample through the sample compartment. In particular, these means may comprise appropriate channels and/or tubing.

Advantageously, the block into which is formed the sample compartment is made of the same type of material as has been described for the jacket of the magnetic field probe, preferably by using the same manufacturing method steps. The substantially planar conductive structure may be formed of thin metal foil segments that are applied on a face of the block.

It will be understood that the magnetic field probe and/or the nuclear magnetic resonance probe may be equipped with suitable electronic components such as tuning and matching circuitry and preamplifier means connected to the conductive structure. Depending on the application, the conductive structure may comprise a single loop or it may be formed as a solenoid or a spiral-type arrangement.

BRIEF DESCRIPTION OF THE DRAWINGS

The above mentioned and other features and objects of this invention and the manner of achieving them will become more apparent and this invention itself will be better understood by reference to the following description of various embodiments of this invention taken in conjunction with the accompanying drawings, wherein.

DESCRIPTION OF THE PREFERRED EMBODIMENTS

In the following, magnetic susceptibility of substances is given as dimensionless volume susceptibility in SI units, wherein ppm stands for $10^{-6}$.

Figure 1:
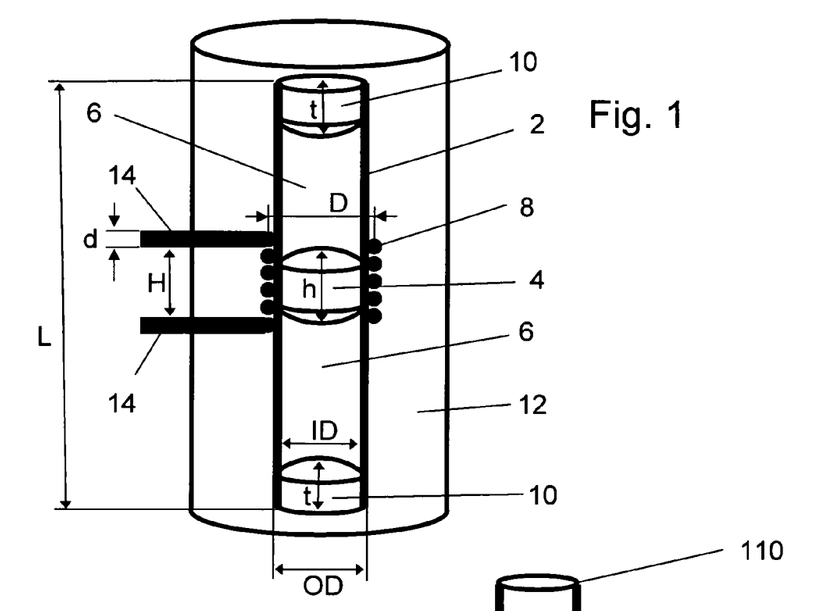
FIG. 1 shows a magnetic field probe, in a schematic perspective view.

The magnetic field probe shown in FIG. 1 comprises a cylindrical glass capillary 2 containing a liquid sample 4, e.g. cyclohexane, which is embedded between two liquid sections of a filler medium 6, e.g. a heavy water solution. The sample exhibits magnetic resonance at an operating frequency. An electrically conductive solenoid structure 8, e.g. Cu wire, is tightly wound around the glass capillary so that several loops surround the sample 4 for receiving a magnetic resonance signal therefrom. For greatest sensitivity of the solenoid, the capillary is oriented substantially perpendicular to the magnetic field to be probed. In MR applications it is hence oriented perpendicular to the main magnetic field. The filler medium 6 further contains a paramagnetic salt, e.g. $MnCl_2$. The ends of the glass capillary 2 are sealed by terminal plugs 10 consisting of a silicone compound which exhibits low viscosity before curing. The entire arrangement consisting of the glass capillary 2 and the conductive structure 8 is encased within a solid cylindrical jacket 12 that is substantially coaxial with the glass capillary. The jacket material, the filler medium and the terminal plugs exhibit negligible or no magnetic resonance at the operating frequency. The jacket material has a magnetic susceptibility that is substantially identical to the magnetic susceptibility of the conductive structure 8. Connection terminals 14 of the conductive structure 8 are led out of the jacket 12.

Figure 2:
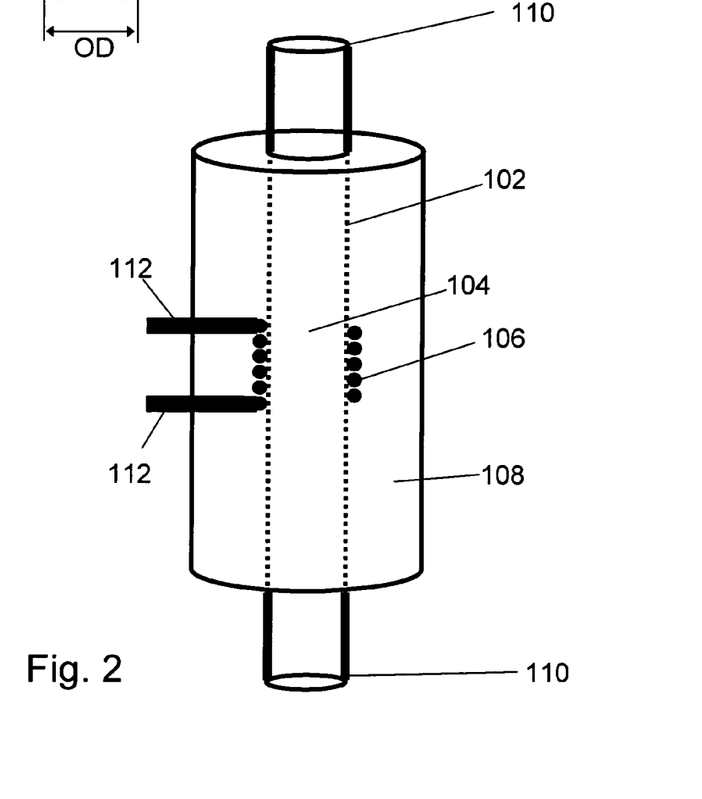
FIG. 2 shows an NMR probe, in a schematic perspective view.

The nuclear magnetic resonance probe shown in FIG. 2 comprises a cylindrical glass capillary 102 containing a liquid sample 104 to be investigated by NMR at an operating frequency. An electrically conductive solenoid structure 106, e.g. Cu wire, is tightly wound around the glass capillary so that several loops surround a portion of the sample 104 for receiving a magnetic resonance signal therefrom. For greatest sensitivity of the solenoid, the capillary is oriented approximately perpendicular to the main magnetic field of the MR apparatus used. The entire arrangement consisting of the glass capillary 102 and the conductive structure 106 is encased within a solid cylindrical jacket 108 that is substantially coaxial with the glass capillary. The jacket material exhibits negligible or no magnetic resonance at the operating frequency. The jacket material has a magnetic susceptibility that is substantially identical to the magnetic susceptibility of the conductive structure 106. The open ends 110 of the capillary 102 extend beyond the jacket, permitting the flow of sample liquid to and from the conductive structure 106. Connection terminals 112 of the conductive structure 106 are led out of the jacket 108.

Figure 3:
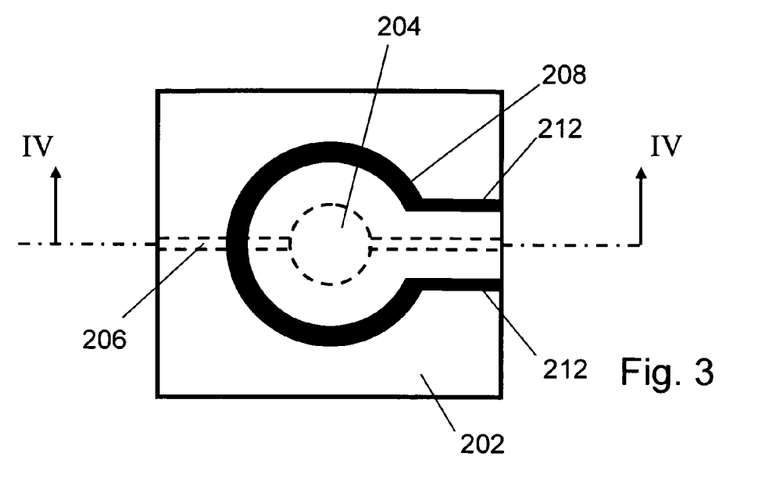
FIG. 3 shows a further NMR probe, in a schematic top view.
Figure 4:
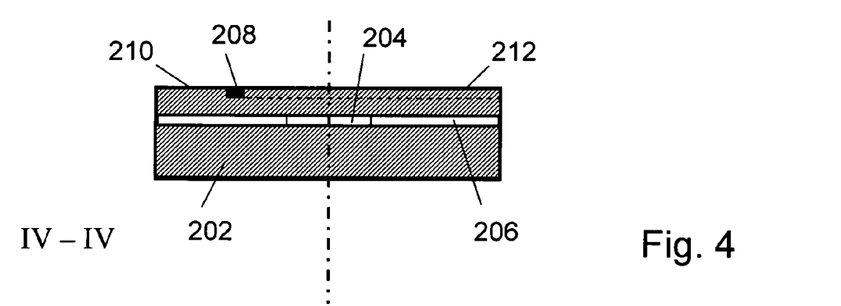
FIG. 4 shows the NMR probe of FIG. 3, in a sectional view according to section IV-IV of FIG. 3.

The nuclear magnetic resonance probe shown in FIGS. 3 and 4 comprises a probe body 202 made from a block of a paramagnetically doped two-component epoxy system into which is formed a flat cylindrical cavity 204 serving as compartment for containment of a liquid sample. A cylindrical channel 206 oriented perpendicularly to the cavity and drilled through the probe body serves as inlet and outlet for the sample liquid. A substantially planar electrically conductive structure 208 applied on the upper face 210 of the probe body forms a loop that is adjacent to and surrounds the sample compartment and that has connection terminals 212. It will be understood that the probe is designed to detect a magnetic resonance signal from the sample at a given operating frequency. Accordingly, the probe body 202 is made of a solid block material that exhibits negligible or no magnetic resonance at the operating frequency. Moreover, the block material has a magnetic susceptibility that is substantially identical to the magnetic susceptibility of the sample liquid.

EXAMPLE 1

Magnetic Field Probe for Nuclear Magnetic Resonance Applications

This example refers to a magnetic field probe as the one schematically shown in FIG. 1, which is useful as a sensor for detecting local magnetic field intensities. In particular, a plurality of such magnetic field probes may be implemented in a NMR system such as the one described in EP 1 582 886 A1, the contents of which are incorporated herein by reference. It will be understood that such a system is operated with a certain static magnetic field and at a certain RF frequency, henceforth called the operating frequency. It will also be understood that the operating frequency is related to the strength of the static magnetic field and to the type of resonating nucleus.

Manufacturing of Magnetic Field Probes with Solid-state Susceptibility Matching

The task of the magnetic field probe is to yield strong and long-lived NMR signals from a well-defined position in space. To meet the latter requirement, the sample in which the probe's NMR signals are generated must be small. For typical MRI applications it should be on the order of 1 mm in diameter. To obtain strong signals from such a small sample, the receiving coil should surround the sample very closely. To maximize the lifetime of the NMR signals (on the order of 100 msec for typical applications), the NMR frequency distribution in the sample should be rendered as narrow as possible. To this end the static magnetic field in the sample must be as homogeneous as possible, despite nearby material interfaces. Material interfaces generally cause field inhomogeneity if the involved materials exhibit different magnetic susceptibility.

Structure of the Magnetic Field Probe

The core of the probe is a cylindrical glass capillary containing a droplet of an NMR-active liquid, which acts as the NMR sample. Above and below the sample, the capillary is filled with another liquid (filler liquid), which exhibits similar magnetic susceptibility as the sample.

For signal reception the filled capillary is inserted into a solenoid coil. The assembly of the capillary and the coil is cast into a cylindrical epoxy cladding with similar magnetic susceptibility as the solenoid.

The susceptibilities of the sample and filler liquids are matched in order to render the inside of the capillary magnetically homogeneous. Likewise, by matching the susceptibilities of the epoxy cladding and the solenoid, the outside of the capillary is rendered magnetically homogeneous. Hence the probe comprises three nested cylindrical layers, each of which is magnetically homogeneous. The objective of this design is to maximize the homogeneity of the magnetic field in the sample. According to the theory of magnetostatics, an assembly of nested, long, homogeneous cylinders, when brought into a homogeneous magnetic field, will exhibit a homogeneous magnetic field in the innermost cylinder. In the present design, the innermost cylinder includes the sample, where the field homogeneity is critical.

The two connecting ends of the solenoid stick out of the epoxy cladding and are connected to tuning and matching circuitry, as usually employed for NMR receivers. Beyond the tuning and matching stage the probe is connected to a preamplifier, whose output is connected to receiving electronics by a coaxial cable.

Sample Preparation

The sample liquid should contain an NMR-active nucleus in high concentration and exhibit a singlet NMR spectrum for long signal lifetime. Based on this requirement, water ($H_2O$) and cyclohexane ($C_6H_{12}$) are used for $^1H$ probes, and hexafluorobenzene ($C_6F_6$) is used for $^{19}F$ probes. The filler liquid must not yield any NMR signal at the same frequency as the sample liquid and it must not mix nor react with the sample liquid. In addition it must permit matching the susceptibilities of the sample and filler liquids. Based on these requirements, hexafluorobenzene is used for matching water samples, heavy water ($D_2O$) is used for matching cyclohexane samples, and water or heavy water is used for matching hexafluorobenzene ($C_6F_6$) samples. Water and heavy water are more diamagnetic than the other liquids. Therefore the susceptibility matching is performed by dissolving an appropriate amount of a paramagnetic salt (e.g. manganese chloride, $MnCl_2$) in the water or heavy water component. Paramagnetic salts or watersoluble rare-earth compounds (such as gadolinium-tetraazacyclododecanetetraacetic, Gd-DOTA) are also used to adjust the relaxation times in water samples.

With respect to the shape of the NMR sample, the combination of nonpolar sample liquids (cyclohexane, hexafluorobenzene) with polar filler liquids (water, heavy water) is preferred because the lower surface tension of the nonpolar liquids leads to more spherical samples, hence offering a better volume-to-diameter ratio.

For holding the sample and the filler liquid, 1-3 cm long borosilicate glass capillaries are used, with diameters on the order of 1 mm and wall thicknesses on the order of 0.1 mm. In filling the capillary it is essential to avoid even smallest air inclusions in or near the sample droplet. To this end generous amounts of the sample and filler liquids are poured into a container (e.g. a vial), forming two layers due to different specific weight. The capillary is mounted on the tip of a syringe, such that the liquids can be drawn into the capillary by moving the piston of the syringe. In this fashion, the desired layers of filler and sample liquid can be drawn into the capillary. By shifting the open end of the capillary forth and back across the interface of the two liquids in the container the sample droplet can be safely taken in without air contact. The sample droplet is typically equally high as it is wide, on the order of 1 mm. The neighbouring layers of filler liquid extend towards the ends of the capillary, filling it completely.

Once filled with the sample and filler liquids, the capillary is sealed with plugs of curing low-viscosity silicone which are injected at the ends of the capillary with a syringe. A two-component silicone material suitable for the present purpose can be purchased from Suter Kunststoffe, Bernfeldweg 4, CH-3303 Jegenstorf, Switzerland, (see http://www.swiss-composite.ch) with the designation Sylgard 184. It comprises a highly transparent moulding mass designated as RTV-184 and a cross-linking additive.

Solenoid

The solenoid is made by winding wire either directly on the capillary or on a cylindrical piece of metal of the same diameter. The wire is chosen such that the overall resistance of the solenoid remains very low and several windings can be realized along the height of the sample droplet. In addition, the wire material is chosen such as to facilitate epoxy cladding with matching magnetic susceptibility. Based on these considerations, copper or silver-plated copper wire with a diameter on the order of 0.1-0.5 mm is typically used, preferably with a thin layer of enamel for insulation.

Epoxy Preparation

The key step in preparing the epoxy system is doping it such that the magnetic susceptibility of the cured epoxy matches the average susceptibility of the wire. Copper, silver, and typical wire enamels are diamagnetic hence the solenoid is diamagnetic, with typical volume susceptibilities of −6 to −9 ppm. To match this susceptibility an epoxy system is chosen that, when cured, is more diamagnetic than the solenoid. The susceptibility match is then achieved by adding an appropriate amount of a paramagnetic dopant to the epoxy resin. Preferred paramagnetic dopants are salts of iron or rare-earth metals. They are introduced to the resin with the help of a solvent, which both dissolves the paramagnetic salt and mixes with the epoxy resin. One example of such a solvent is acetone, which dissolves iron chloride and iron nitrate as well as the nitrates of several rare-earth metals (such as erbium, dysprosium, and gadolinium), and mixes with many epoxy resins.

A two-component epoxy system suitable for the present purpose can be purchased from Suter Kunststoffe, Bernfeldweg 4, CH-3303 Jegenstorf, Switzerland, (see http://www.swiss-composite.ch); it comprises "Epoxidharz Typ L" as the epoxy resin and "Härter EPH-161" as the hardener or curing agent.

For doping a given epoxy resin with a paramagnetic salt, first a highly concentrated solution of the salt in acetone is prepared. Then the required amount of this solution is mixed with the resin. After this step the acetone is preferably removed, e.g. by degassing, in order to facilitate curing and to prevent the formation of gas bubbles in the epoxy. The doped resin is then mixed with the appropriate amount of hardener.

For a given type of wire the appropriate dopant concentration is identified by reference MRI experiments. First, a "wire-equivalent" liquid is generated whose magnetic susceptibility is the same as that of the wire. Typically this liquid is an aqueous solution, which is titrated with a paramagnetic salt such that a bundle of the wire, when immersed, causes no susceptibility effects in MR phase images of the solution. The remaining task is then to identify the dopant concentration which renders the cured epoxy equally magnetically susceptible as the wire-equivalent solution. To this end, a series of reference epoxy cylinders with gradually increasing dopant load has been created. Phase-sensitive MR imaging of the wire-equivalent solution is repeated with each of these reference cylinders immersed. That which causes the least susceptibility effects in the image indicates the dopant concentration needed for the respective type of wire.

For matching typical wires, the susceptibility of epoxy usually needs to be adjusted only by a few ppm, which is possible with iron chloride doping and equally feasible with very small amounts of rare-earth doping. Greater shifts in the epoxy susceptibility are useful for other applications, e.g. for generating epoxy that is susceptibility-matched to air, with a volume susceptibility between 0 and +1 ppm, or even to considerably paramagnetic materials such as aluminum with a susceptibility around +20 ppm. These stronger susceptibility adjustments are most feasible with rare-earth dopants, such as erbium nitrate, dysprosium nitrate and gadolinium nitrate.

Casting of the Epoxy Cladding

For forming the cylindrical epoxy cladding, the solenoid is mounted in the center of a cylindrical mould, with the ends of the solenoid wire sticking out. The mould is then filled with the mixture of the doped epoxy resin and the epoxy hardener. Then the capillary is inserted into the solenoid, such that the NMR active sample is centered inside the solenoid.

Once the epoxy has cured, the magnetic field probe is demoulded. For easier demoulding the mould can initially be treated with demoulding agents such as waxes or polyvinyl alcohol.

EXAMPLE 2

Nuclear Magnetic Resonance Probe

This example refers to a NMR probe as the one schematically shown in FIG. 2. Such probes are useful e.g. for obtaining NMR spectra or NMR intensity data from small liquid samples, as described in Olson D. L. et al., *Science;* 270 No. 5244 (1995) pp. 1967-1970, the contents of which are incorporated herein by reference. The probe described here includes a jacket whose magnetic susceptibility can be accurately matched to that of the solenoid coil used for signal detection. In this fashion the solenoid is prevented from causing magnetic field distortions in the sample. As a consequence the solenoid can be mounted more closely to the sample, using a sample container with a thinner wall, which leads to significantly enhanced overall sensitivity.

EXAMPLE 3

Nuclear Magnetic Resonance Probe

This example refers to a NMR probe as the one schematically shown in FIGS. 3 and 4. Such probes are useful e.g. for obtaining NMR spectra or NMR intensity data from small liquid samples, as described in Massin, loc. cit., the contents of which are incorporated herein by reference. It will be understood that the electrically conductive structure shown in FIGS. 3 and 4 as a simple loop may be replaced by other structures, depending on the particular application.

By virtue of the fact that in the probe described here the magnetic susceptibility of the probe body can be accurately matched to the magnetic susceptibility of the sample contained therein, the main factor limiting the sensitivity of the NMR probe described by *Massin, loc. cit.* for high-resolution applications has been significantly reduced.

EXAMPLE 4

Recipes Used for Susceptibility Matching

The following are examples on the materials and quantities used for preparing susceptibility matched two-component epoxy systems. References indicated with superscripts are listed after Example 5.

Case 1

Matching the magnetic susceptibility of a two-component epoxy (resin: "Epoxydharz Typ L"[1]) and curing agent "Härter EPH-1611", in the ratio 100:25) to that of a copper wire (Enameled copper wire[2]: Cu diameter 0.40 mm, enamel Polysol-155, wire outer diameter 0.4230 mm) by adding $Dy(III)(NO_3)$ $3.5H_2O$ (Dysprosium(III) nitrate hydrate, assay 99.9%, product number 298158[3]) to the epoxy:

Magnetic susceptibility of pure epoxy (cured at 7 bar for 24 hours): −9.7 ppm Magnetic susceptibility of Cu wire: −8.9 ppm.

To match the magnetic susceptibility of the epoxy to the Cu-wire: add 0.55 mg of $Dy(III)(NO_3)$ $3.5H_2O$ per 1 g of epoxy.

Case 2

Matching the magnetic susceptibility of an epoxy (Epoxydharz Typ L[1] with Härter EPH-1611) in the ratio 100:25) to that of air (at normal temperature and pressure) by adding $Dy(III)(NO_3)$ $3.5H_2O$ (Dysprosium(III) nitrate hydrate, assay 99.9%, product number 298158[3])) to the epoxy:

Magnetic susceptibility of pure epoxy (cured at 7 bar for 24 hours): −9.7 ppm Magnetic susceptibility of air at normal temperature and pressure[4]: 0.36 ppm.

To match the magnetic susceptibility of the epoxy to air: add 6.92 mg of $Dy(III)(NO_3)$ $3.5H_2O$ per 1 g of epoxy.

Remarks

Typical salt concentrations in the acetone (before it is mixed with the epoxy resin) are 0.5 g of salt per 20 ml of acetone. However, this concentration can be varied largely.

Other salts that are dissolving in acetone and can be brought into epoxy:
$Gd(III)(NO_3)$ $3.6H_2O$
$Er(III)(NO_3)$ $3.5H_2O$
$Fe(III)Cl_3$ anhydrous Moreover all nitrates of the remaining Lanthanides (in particular Eu, Tb and Ho) are also expected to dissolve in acetone.

EXAMPLE 5

Geometric Dimensions of Probes

The following are examples for the geometric dimensions and materials of magenetic susceptibility matched probes. References indicated with superscripts are listed at the end of Example 5.

Case 1

The geometry (and all the abbreviations in parentheses) refer to a magnetic field probe as shown in FIG. 1.

Conducting structure: Enameled copper wire[2]: Cu diameter 0.40 mm, enamel Polysol-155, wire outer diameter 0.4230 mm. Number of windings: 6. Inner diameter (D) of windings: 1.7 mm. Total height (H) of the winding: 2.6 mm.

Sample container: Pyrex NMR capillary tube[5], inner diameter (ID) 1.3 mm, outer diameter (OD) 1.7 mm, length (L) 17.0 mm.

Droplet: Height (h) 1.3 mm.

Tap: Silicone RTV-184[1], height (t) 2.0 mm

Case 2

The geometry (and all the abbreviations in parentheses) refer to a magnetic field probe as shown in FIG. 1.

Conducting structure: Enameled copper wire[2]: Cu diameter 0.20 mm, enamel Polysol-155, wire outer diameter 0.2180 mm. Number of windings: 6. Inner diameter (D) of windings: 1.0 mm. Total height (H) of the winding: 1.35 mm.

Sample container: Pyrex NMR capillary tube[5], inner diameter (ID) 0.8 mm, outer diameter (OD) 1.0 mm, length (L) 15.0 mm.

Droplet: Height (h) 0.8 mm.

Tap: Silicone RTV-184[1], height (t) 1.8 mm

Case 3

The geometry (and all the abbreviations in parentheses) refers to a nuclear magnetic resonance probe similar to the one shown in FIG. 2, but provided with terminal taps closing the sample compartment 104. The abbreviations in parentheses refer to FIG. 1.

Conducting structure: Enameled copper wire[2]: Cu diameter 0.20 mm, enamel Polysol-155, wire outer diameter 0.2180 mm. Number of windings: 3. Inner diameter (D) of windings: 1.0 mm. Total height (H) of the winding: 0.65 mm.

Sample container: Pyrex NMR capillary tube[5], inner diameter (ID) 0.8 mm, outer diameter (OD) 1.0 mm, length (L) 15.0 mm.

Tap: Silicone RTV-184[1], height (t) 1.8 mm

Case 4

The geometry (and all the abbreviations in parentheses) refers to a nuclear magnetic resonance probe similar to the one shown in FIG. 2, but provided with terminal taps closing the sample compartment 104. The abbreviations in parentheses refer to FIG. 1.

Conducting structure: Enameled copper wire[2]: Cu diameter 0.09 mm, enamel Polysol-155, wire outer diameter 0.0960 mm. Number of windings: 5. Inner diameter (D) of windings: 1.0 mm. Total height (H) of the winding: 0.50 mm.

Sample container: Pyrex NMR capillary tubes[5], inner diameter (ID) 0.8 mm, outer diameter (OD) 1.0 mm, length (L) 15.0 mm.

Tap: Silicone RTV-184[1], height (t) 1.8 mm

REFERENCES FOR EXAMPLES 4 AND 5

[1] Suter Kunststoffe A G, Faserverbundwerkstoffe, Bernfeldweg 4, 3303 Jegenstorf, Switzerland
[2] Elektrisola Feindraht A G, Hauptstrasse 35, 6182 Escholzmatt, Switzerland
[3] Sigma-Aldrich, Industriestrasse 25, 9470 Buchs/SG, Switzerland
[4] John F. Schenck, The role of magnetic susceptibility in magnetic resonance imaging: MRI magnetic compatibility of the first and second kinds, Med. Phys. 23(6), June 1996.

The invention claimed is:

1. A magnetic field probe, particularly for magnetic resonance applications, comprising:
  a sample (4) that exhibits magnetic resonance at an operating frequency;
  an electrically conductive structure (8) surrounding the sample for receiving a magnetic resonance signal therefrom; and
  a solid jacket (12) encasing the sample and the conductive structure;

the jacket having a magnetic susceptibility that is substantially identical to the magnetic susceptibility of the conductive structure;

characterized in that the jacket is made of a hardened two-component epoxy system containing an uncomplexed paramagnetic dopant dissolved therein, the concentration of the dopant being chosen such that the jacket has a magnetic susceptibility that is substantially identical to the magnetic susceptibility of the conductive structure.

2. The magnetic field probe according to claim 1, wherein the uncomplexed paramagnetic dopant comprises a metal ion or a rare earth metal ion, particularly $Fe^{2+}$, $Fe^{3+}$, $Er^{3+}$ $Dy^{3+}$, or $Gd^{3+}$.

3. The magnetic field probe according to claim 1, wherein the jacket has ellipsoidal geometry.

4. The magnetic field probe according to claim 1, wherein the conductive structure comprises at least one loop portion.

5. The magnetic field probe according to claim 1, further comprising a core with ellipsoidal geometry arranged within said conductive structure, the core comprising a pair of terminal sections (6) and a central section (4) embedded therebetween, the central section being formed by said sample and the terminal sections being formed by a filler medium that does not exhibit magnetic resonance at the operating frequency, the filler medium having a magnetic susceptibility that is substantially identical to the magnetic susceptibility of the sample.

6. The magnetic field probe according to claim 5, wherein the core further comprises a substantially cylindrical housing (2) containing the sample and the filler medium.

7. The magnetic field probe according to claim 5, wherein the sample and the filler medium are mutually immiscible liquids.

8. The magnetic field probe according to claim 7, wherein the sample is cyclohexane.

9. The magnetic field probe according to claim 7, wherein the filler medium is a solution of a paramagnetic salt in heavy water, the concentration of the salt being chosen such that the solution has a magnetic susceptibility that is substantially identical to the magnetic susceptibility of the sample.

10. The magnetic field probe according to claim 9, wherein the paramagnetic salt is a manganese(II) salt or copper(II) salt, particularly $MnCl_2$ or $CuSO_4$.

11. The magnetic field probe according to claim 7, wherein the sample is-hexafluorobenzene.

12. The magnetic field probe according to claim 7, wherein the filler medium is a solution of a paramagnetic salt in water, the concentration of the salt being chosen such that the solution has a magnetic susceptibility that is substantially identical to the magnetic susceptibility of the sample.

13. A method for manufacturing a magnetic field probe, comprising the steps of:
a) providing a sample that exhibits magnetic resonance at an operating frequency and further providing an electrically conductive structure surrounding the sample for receiving a magnetic resonance signal therefrom;
b) providing a first amount of an epoxy resin and admixing thereto a second amount of a solution comprising an uncomplexed paramagnetic dopant in a solvent, thus forming a paramagnetically doped epoxy resin;
c) degassing the doped epoxy resin;
d) admixing a third amount of a hardening agent to the doped epoxy resin, thus forming a doped two-component epoxy system;
e) shaping the doped two-component epoxy system around the sample and the conductive structure so as to form a jacket; and
f) allowing the doped two-component epoxy system to harden;

wherein the content of uncomplexed paramagnetic dopant in the doped two-component epoxy system is chosen to provide the jacket with a magnetic susceptibility that is substantially identical to the magnetic susceptibility of the conductive structure.

14. The method according to claim 13, wherein the uncomplexed paramagnetic dopant is selected from the group consisting of $FeCl_2$, $FeCl_3$, $Fe(NO_3)_3$, $Er(NO_3)_3$, $Dy(NO_3)_3$, and $Gd(NO_3)_3$.

15. The method according to claim 13, wherein the solvent is acetone.

16. The method according to claim 13 for manufacturing a magnetic field probe in which a sample and filler medium are mutually immiscible liquids, wherein said step a) comprises the steps of:
providing a container with an amount of the liquid sample and an amount of the liquid filler medium immiscible therewith so as to form a two-layer system;
providing an open-ended glass capillary tube having a proximal end and a distal end, the proximal end being connected to a suction device for drawing liquid into the tube;
immersing the distal end into the layer of liquid filler medium;
drawing a first portion of filler medium into the capillary tube;
moving the distal end into the layer of liquid sample;
drawing a portion of sample into the capillary tube;
moving the distal end back into the layer of liquid filler medium;
drawing a second portion of filler medium into the capillary tube;
raising the distal end out of the two-layer system;
sealing off the distal end and the proximal end so as to form a sealed tube, the sealed tube thus forming a substantially cylindrical core comprising:
the portion of sample forming a central section of the core;
the first portion and the second portion of filler medium, or fractions thereof, embedding the central section so as to form terminal sections of the core;
arranging an electrically conductive structure around the core;
arranging the jacket around the core and the conductive structure;
wherein:
the filler medium has a magnetic susceptibility that is substantially identical to the magnetic susceptibility of the sample, and
the jacket has a magnetic susceptibility that is substantially identical to the magnetic susceptibility of the conductive structure.

17. A method for manufacturing a magnetic probe as defined in claim 13 wherein the step of shaping is performed using a casting mold; and an additional step comprises removing the casting mold after the two-component epoxy system has hardened.

18. A method for manufacturing a magnetic probe as defined in claim 13 including the step of degassing the doped two-component epoxy system after admixing a hardening agent.

19. A nuclear magnetic resonance apparatus comprising:

a main magnetic field magnet;

gradient coils for generating gradient magnetic fields superimposed to the main magnetic field;

means for delivering a radio frequency signal at an operating frequency;

at least one radio frequency receiver coil for acquiring a plurality of object signals from the object to be examined;

magnetic field detecting means positioned in the vicinity of and surrounding the object to be examined;

means for calculating a model of the magnetic field behavior in the object from data from the local magnetic field detecting means; and means for reconstructing images or spectra from the additional data from the magnetic field detecting means in conjunction with the object signals; the magnetic field detecting means comprising at least one magnetic field probe having a magnetic field probe, particularly for magnetic resonance applications, comprising:

a sample (4) that exhibits magnetic resonance at an operating frequency;

an electrically conductive structure (8) surrounding the sample for receiving a magnetic resonance signal therefrom; and a solid jacket (12) encasing the sample and the conductive structure;

the jacket having a magnetic susceptibility that is substantially identical to the magnetic susceptibility of the conductive structure;

characterized in that the jacket is made of a hardened two-component epoxy system containing an uncomplexed paramagnetic dopant dissolved therein, the concentration of the dopant being chosen such that the jacket has a magnetic susceptibility that is substantially identical to the magnetic susceptibility of the conductive structure.

20. A nuclear magnetic resonance probe comprising:

a compartment (102) for containment of a liquid sample (104) that exhibits nuclear magnetic resonance at an operating frequency;

an electrically conductive structure (106) adjacent to the sample compartment for receiving a nuclear magnetic resonance signal from the sample;

a solid jacket (108) encasing the sample and the conductive structure; characterized in that the jacket is made of a hardened two-component epoxy system containing an uncomplexed paramagnetic dopant dissolved therein, the concentration of the dopant being chosen such that the jacket has a magnetic susceptibility that is substantially identical to the magnetic susceptibility of the conductive structure.

21. The nuclear magnetic resonance probe according to claim 20, further comprising means for flowing liquid sample through the compartment.

22. A nuclear magnetic resonance probe comprising:

a substantially flat compartment for containment of a liquid sample that exhibits nuclear magnetic resonance at an operating frequency, the sample compartment being formed within a block made of a solid block material;

an electrically conductive structure adjacent to the sample compartment for receiving a nuclear magnetic resonance signal from the sample;

characterized in that the block is made of a hardened two-component epoxy system containing a an uncomplexed paramagnetic dopant dissolved therein, the concentration of the dopant being chosen such that the block has a magnetic susceptibility that is substantially identical to the magnetic susceptibility of the conductive structure.

23. A method of adjusting magnetic field homogeneity within a device in a magnetic field comprising employing a doped two-component epoxy system containing a dissolved uncomplexed paramagnetic dopant, and choosing the concentration of the uncomplexed paramagnetic dopant such that the magnetic susceptibility of the doped two-component epoxy system is substantially equal to the magnetic susceptibility of said device or a part thereof.

* * * * *